United States Patent
Wasyluk et al.

(10) Patent No.: US 9,064,961 B2
(45) Date of Patent: Jun. 23, 2015

(54) INTEGRATED CIRCUITS INCLUDING EPITAXIALLY GROWN STRAIN-INDUCING FILLS DOPED WITH BORON FOR IMPROVED ROBUSTNESS FROM DELIMINATION AND METHODS FOR FABRICATING THE SAME

(71) Applicant: GLOBALFOUNDRIES, Inc., Grand Cayman (KY)

(72) Inventors: Joanna Wasyluk, Dresden (DE); Carsten Reichel, Dresden (DE); Joachim Patzer, Langebueck (DE); Kai Wurster, Dresden (DE)

(73) Assignee: GLOBAL FOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/030,104

(22) Filed: Sep. 18, 2013

(65) Prior Publication Data

US 2015/0076560 A1    Mar. 19, 2015

(51) Int. Cl.
*H01L 29/78* (2006.01)
*H01L 27/088* (2006.01)
*H01L 21/02* (2006.01)
*H01L 29/66* (2006.01)

(52) U.S. Cl.
CPC .......... *H01L 29/7848* (2013.01); *H01L 27/088* (2013.01); *H01L 21/02694* (2013.01); *H01L 21/02532* (2013.01); *H01L 29/66636* (2013.01)

(58) Field of Classification Search
CPC . H01L 29/165; H01L 29/665; H01L 29/6659; H01L 29/66636; H01L 29/7834; H01L 29/7842; H01L 29/7848
See application file for complete search history.

(56) References Cited

U.S. PATENT DOCUMENTS

| 7,737,007 | B2 * | 6/2010 | Samoilov et al. | 438/478 |
| 2010/0301350 | A1 * | 12/2010 | Tamura et al. | 257/77 |
| 2012/0164805 | A1 | 6/2012 | Kronholz et al. | |
| 2012/0267683 | A1 | 10/2012 | Kronholz et al. | |

* cited by examiner

*Primary Examiner* — Matthew W Such
*Assistant Examiner* — Scott Stowe
(74) *Attorney, Agent, or Firm* — Ingrassia Fisher & Lorenz, P.C.

(57) ABSTRACT

Integrated circuits and methods for fabricating integrated circuits are provided. In one example, a method for fabricating an integrated circuit includes forming a cavity in a semiconductor region laterally adjacent to a gate electrode structure. An EPI strain-inducing fill is deposited into the cavity. The EPI strain-inducing fill includes a main SiGe layer and a Si cap that overlies the main SiGe layer. The EPI strain-inducing fill is doped with boron and has a first peak boron content in an upper portion of the EPI strain-inducing fill of about 2.5 times or greater than an average boron content in an intermediate portion of the main SiGe layer.

19 Claims, 3 Drawing Sheets

US 9,064,961 B2

INTEGRATED CIRCUITS INCLUDING EPITAXIALLY GROWN STRAIN-INDUCING FILLS DOPED WITH BORON FOR IMPROVED ROBUSTNESS FROM DELIMINATION AND METHODS FOR FABRICATING THE SAME

TECHNICAL FIELD

The technical field relates generally to integrated circuits and methods for fabricating integrated circuits, and more particularly relates to integrated circuits including epitaxially grown strain-inducing fills that include silicon germanium (SiGe) doped with boron for improved robustness from delamination and methods for fabricating such integrated circuits.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A FET includes a gate electrode structure as a control electrode and spaced apart source and drain electrodes (i.e., source and drain regions) between which a current can flow. A control voltage applied to the gate electrode structure controls the flow of current through a channel region between the source and drain electrodes.

The gain of an FET, usually defined by the transconductance ($g_m$), is proportional to the mobility of the majority carrier in the transistor channel region. The current carrying capability of an MOS transistor is proportional to the transconductance times the width of the channel region divided by the length of the channel ($g_m W/l$). FETs are usually fabricated on silicon substrates with a (100) crystallographic surface orientation, which is conventional for silicon technology. For this and many other orientations, the mobility of holes, the majority carrier in a P-channel FET (PFET), can be increased by applying a compressive longitudinal stress to the channel region. A compressive longitudinal stress can be applied to the channel region of a FET by embedding an expanding material such as pseudomorphic silicon germanium (SiGe) formed by a selective epitaxial growth process in the silicon substrate at the ends of the transistor channel region (epitaxial SiGe at the ends of the transistor channel also referred to herein as "eSiGe strain-inducing fill"). The eSiGe strain-inducing fill is doped with an appropriate P-type dopant such as boron (B) to form the source and drain regions of the PFET.

As device sizes decrease, such as to 28 nm critical dimensions (CD) devices and below, higher optical resolution lithography techniques are used for forming, for example, extension and halo implants in the IC after formation of the source and drain regions. One such high resolution technique is argon fluoride (ArF) laser lithography, which uses an ArF photoresist for selectively implanting various layers of the IC. ArF photoresists typically cannot be removed with standard $O_2$-based plasma strips but rather are removed using more aggressive $NH_3/O_2$-based plasma strips. Unfortunately, it has been found that by exposing a boron doped eSiGe strain-inducing fill to the $NH_3/O_2$-based plasma strips and heating the IC during plasma stripping and/or during subsequent processing, localized delamination of the boron doped eSiGe strain-inducing fill can result. In particular, hydrogen produced from the $NH_3/O_2$-based plasma strips diffuses into the boron doped eSiGe strain-inducing fill. During heating of the IC (e.g., during plasma stripping and/or further downstream processing), the diffused hydrogen accumulates or agglomerates and can form bubbles or blisters that result in localized delamination of the boron doped eSiGe strain-inducing fill.

Accordingly, it is desirable to provide integrated circuits including a boron doped eSiGe strain-inducing fill with improved robustness for processing and methods for fabricating such integrated circuits. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes forming a cavity in a semiconductor region laterally adjacent to a gate electrode structure. An EPI strain-inducing fill is deposited into the cavity. The EPI strain-inducing fill includes a main SiGe layer and a Si cap that overlies the main SiGe layer. The EPI strain-inducing fill is doped with boron and has a first peak boron content in an upper portion of the EPI strain-inducing fill of about 2.5 times or greater than an average boron content in an intermediate portion of the main SiGe layer.

In accordance with another exemplary embodiment, a method for fabricating an integrated circuit is provided. The method includes etching a cavity in a semiconductor region laterally adjacent to a gate electrode structure. A buffer SiGe layer is epitaxially grown in a lower portion of the cavity. A main SiGe layer that is in-situ boron doped is epitaxially grown in the cavity overlying the buffer SiGe layer. A Si cap that is in-situ boron doped is deposited overlying the main SiGe layer such that a peak boron content in the Si cap or proximate an interface of the main SiGe layer and the Si cap is of about 2.5 times or greater than an average boron content in an intermediate portion of the main SiGe layer.

In accordance with another exemplary embodiment, an integrated circuit is provided. The integrated circuit includes a silicon-containing semiconductor region. A channel region is formed in the silicon-containing semiconductor region. A gate electrode structure is formed above the channel region. Source and drain regions are formed in the silicon-containing semiconductor region adjacent to the channel region. The source and drain regions include an EPI strain-inducing fill that includes a main SiGe layer and a Si cap that overlies the main SiGe layer. The EPI strain-inducing fill is doped with boron and has a first peak boron content in an upper portion of the EPI strain-inducing fill of about 2.5 times or greater than an average boron content in an intermediate portion of the main SiGe layer. A metal silicide is formed in the EPI strain-inducing fill and at least partially in the source and drain regions.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
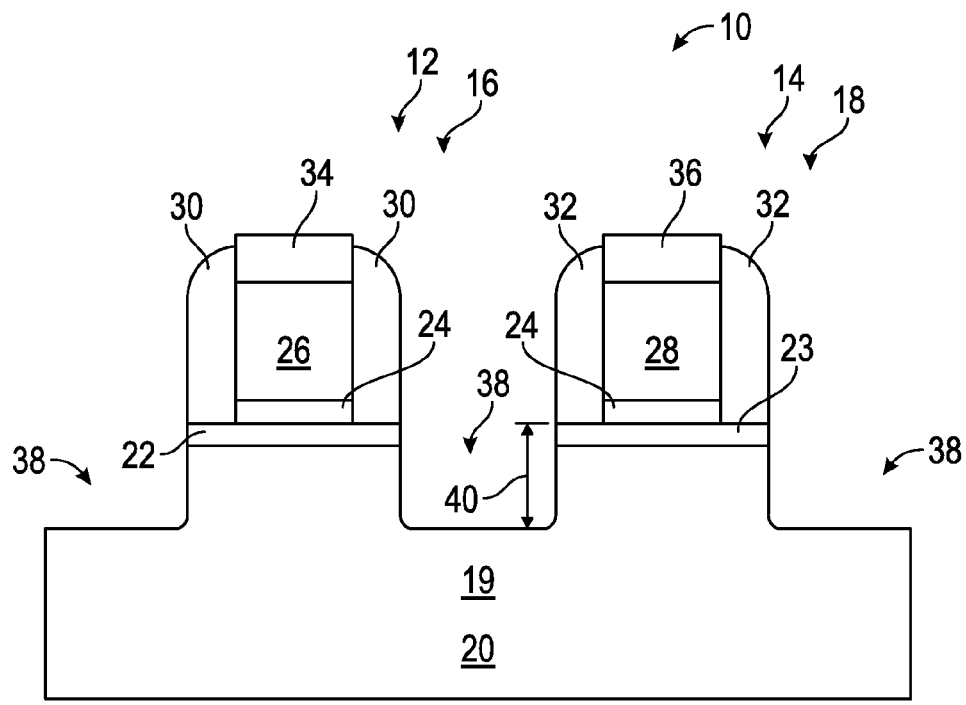
FIG. 1 illustrates, in cross-sectional view, an integrated circuit during an intermediate fabrication stage in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits including an epitaxially grown (EPI) strain-inducing fill and methods for fabricating such integrated circuits. During intermediate stages of fabrication of an integrated circuit (IC), a cavity is formed in a semiconductor region laterally adjacent to a gate electrode structure. In an exemplary embodiment, the gate electrode structure forms part of a P-type transistor (i.e., PFET). An EPI strain-inducing fill is deposited into the cavity using a selective epitaxial growth process. In an exemplary embodiment, the EPI strain-inducing fill comprises a buffer SiGe layer disposed in a lower portion of the cavity, a main SiGe layer overlying the buffer SiGe layer, and a Si cap overlying the main SiGe layer. The EPI strain-inducing fill is doped with boron to form the source and drain regions for the P-type transistor. In an exemplary embodiment, the EPI strain-inducing fill has a peak boron content in an upper portion of the EPI strain-inducing fill (e.g., in the Si cap or proximate the interface of the Si cap and the main SiGe layer) of about 2.5 times or greater than an average boron content in an intermediate portion of the main SiGe layer.

In an exemplary embodiment, after depositing the EPI strain-inducing fill, a photoresist layer that overlies a second gate electrode structure, for example, of a N-type transistor, is stripped using an $NH_3/O_2$ plasma while exposing the EPI strain-inducing fill to the $NH_3/O_2$ plasma. During plasma stripping, hydrogen from the $NH_3/O_2$ plasma diffuses into the EPI strain-inducing fill. The IC including the EPI strain-inducing fill is heated during plasma stripping and/or subsequently during downstream processing to a temperature of about 250° C. or greater (e.g., about 250 to about 300° C. for plasma stripping and/or about 400° C. or greater for further downstream processing), for example. It has been found that during heating, the diffused hydrogen tends to concentrate in portions of the EPI strain-inducing fill with the higher boron content. As such, the diffused hydrogen tends to concentrate proximate the upper portion of the EPI strain-inducing fill where the concentration of boron is significantly higher than the concentration of boron in the intermediate portion of the strain-inducing fill. Additionally, it has been found that by concentrating the diffused hydrogen in or proximate the Si cap instead of in or proximate the lower portions, e.g., intermediate and/or lower portions, of the EPI strain-inducing fill, the formation of bubbles or blisters is minimized or eliminated to reduce, minimize, or eliminate localized delamination of the EPI strain-inducing fill.

FIGS. 1-4 illustrate methods for fabricating an integrated circuit 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of integrated circuits are well known and so, in the interest of brevity, many conventional steps will only be mentioned briefly herein or will be omitted entirely without providing the well-known process details.

FIG. 1 illustrates, in cross-sectional view, a portion of the integrated circuit 10 during an intermediate fabrication stage in accordance with an exemplary embodiment. As illustrated, the integrated circuit 10 includes semiconductor devices 12 and 14 that are MOS transistors 16 and 18. The MOS transistors 16 and 18 are fabricated on a semiconductor region 19 of a silicon substrate 20, which can be either a bulk silicon wafer as illustrated or a thin silicon layer on an insulating substrate (SOI). As used herein, the terms "silicon layer" and "silicon substrate" are used to encompass the relatively pure or lightly impurity-doped monocrystalline silicon materials typically used in the semiconductor industry as well as silicon admixed with other elements such as germanium, carbon, and the like to form a substantially monocrystalline semiconductor material. In an exemplary embodiment, surface portions of the semiconductor region 19 are appropriately doped with conductivity-determining impurities (e.g., N-type conductivity-determining impurities such as arsenic ions (As) and the like) to define the MOS transistors 16 and 18 as P-channel MOS transistors with channel regions 22 and 23 as is well known in the art.

A layer of gate insulating material 24 is formed overlying each of the channel regions 22 and 23. Gate electrode structures 26 and 28 are formed correspondingly overlying the layers of gate insulating material 24. Each of the layers of gate insulating material 24 can be a layer of thermally grown silicon dioxide, or alternatively, a deposited insulator such as a silicon oxide, silicon nitride, a high dielectric constant insulator such as hafnium silicate ($HfSiO_x$, where x is greater than zero), or the like. The deposited insulators can be deposited, for example, by chemical vapor deposition (CVD), low pressure chemical vapor deposition (LPCVD), or plasma enhanced chemical vapor deposition (PECVD). The layers of gate insulating material 24 may have a corresponding thickness of from about 1 to about 10 nm, although the actual thickness can be determined based on the application of the transistor in the circuit being implemented.

The gate electrode structures 26 and 28 include an electrically conductive material, such as a metal or metal alloy, or a material that can be made electrically conductive and formed by depositing, patterning, and etching, for example, a layer of polycrystalline silicon, such as a layer of undoped polycrystalline silicon. The gate electrode structures 26 and 28 generally have a corresponding thickness of from about 30 to about 100 nm. The polycrystalline silicon can be deposited, for example, by the reduction of silane in a CVD reaction.

Sidewall spacers 30 and 32 are formed on the sidewalls of the gate electrode structures 26 and 28 and cap layers 34 and 36 are formed on upper portions of the gate electrode structures 26 and 28. In an exemplary embodiment, the cap layers 34 and 36 are formed by depositing a layer of silicon nitride overlying the gate electrode structures 26 and 28 and patterning the same on the basis of lithography and etch techniques. Next, the sidewall spacers 30 and 32 are formed by depositing a layer of insulating material such as silicon oxide and/or silicon nitride and subsequently anisotropically etching the insulating layer, for example by reactive ion etching (RIE). Alternatively, silicon oxide and silicon nitride can be etched, for example, in a $CHF_3$, $CF_4$, or $SF_6$ chemistry.

In an exemplary embodiment, using the sidewall spacers 30 and 32 and the cap layers 34 and 36 as etch masks, substantially box-shaped cavities 38 are etched into the semiconductor region 19 laterally adjacent to the gate electrode structures 26 and 28. In one example, the box-shaped cavities 38 are formed on the basis of a substantially anisotropic etch behavior accomplished on the basis of a dry etching process, such as a plasma assisted etch, for example RIE. In an exemplary embodiment, the box-shaped cavities 38 have a depth (indicated by double headed arrow 40) of from about 10 to about 50 nm.

Figure 2:
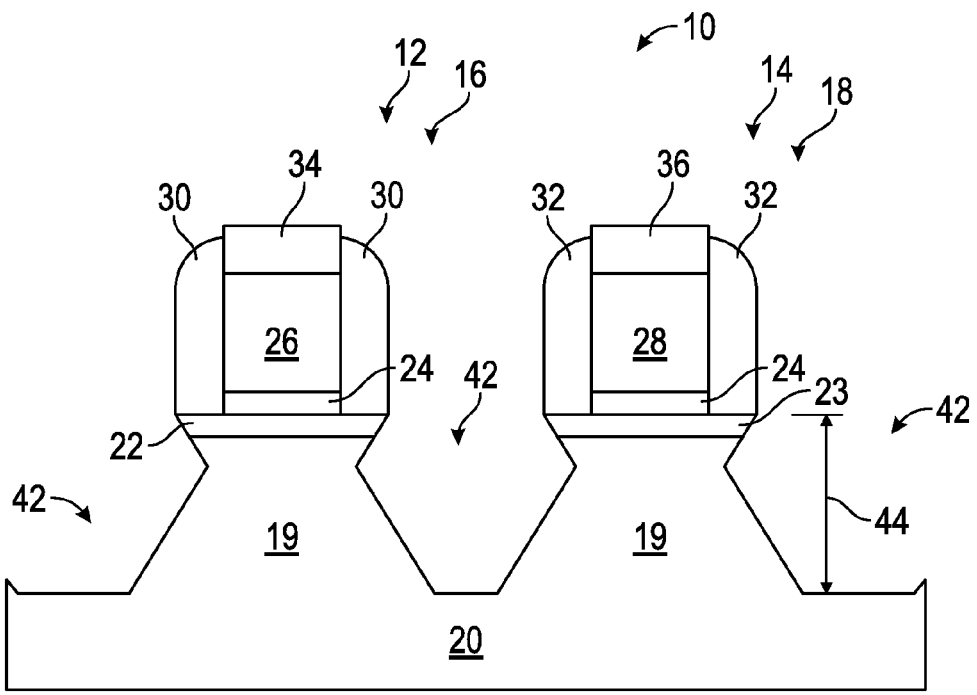
FIG. 2 illustrates, in cross-sectional view, an integrated circuit during a further advanced fabrication stage in accordance with an exemplary embodiment.

FIG. 2 illustrates, in cross-sectional view, the integrated circuit 10 during a further advanced fabrication stage in accordance with an exemplary embodiment. The box-shaped cavities 38 (shown in FIG. 1) are further etched to form sigma-shaped cavities 42. In an exemplary embodiment, the sigma-shaped cavities 42 are formed on the basis of a substantially isotropic etch behavior accomplished on the basis of a wet etching process. In an exemplary embodiment, the wet etching process includes tetra-methyl ammonium hydroxide (TMAH) as an etchant. It has been found that TMAH concentrations of from about 5 to about 25 weight percent in water and etched temperatures of from about 60 to about 90° C. are useful for forming the sigma-shaped cavities 42. In an exemplary embodiment, the sigma-shaped cavities 42 have a depth (indicated by double headed arrow 44) of from about 40 to about 100 nm, such as from about 50 to about 70 nm.

Figure 3:
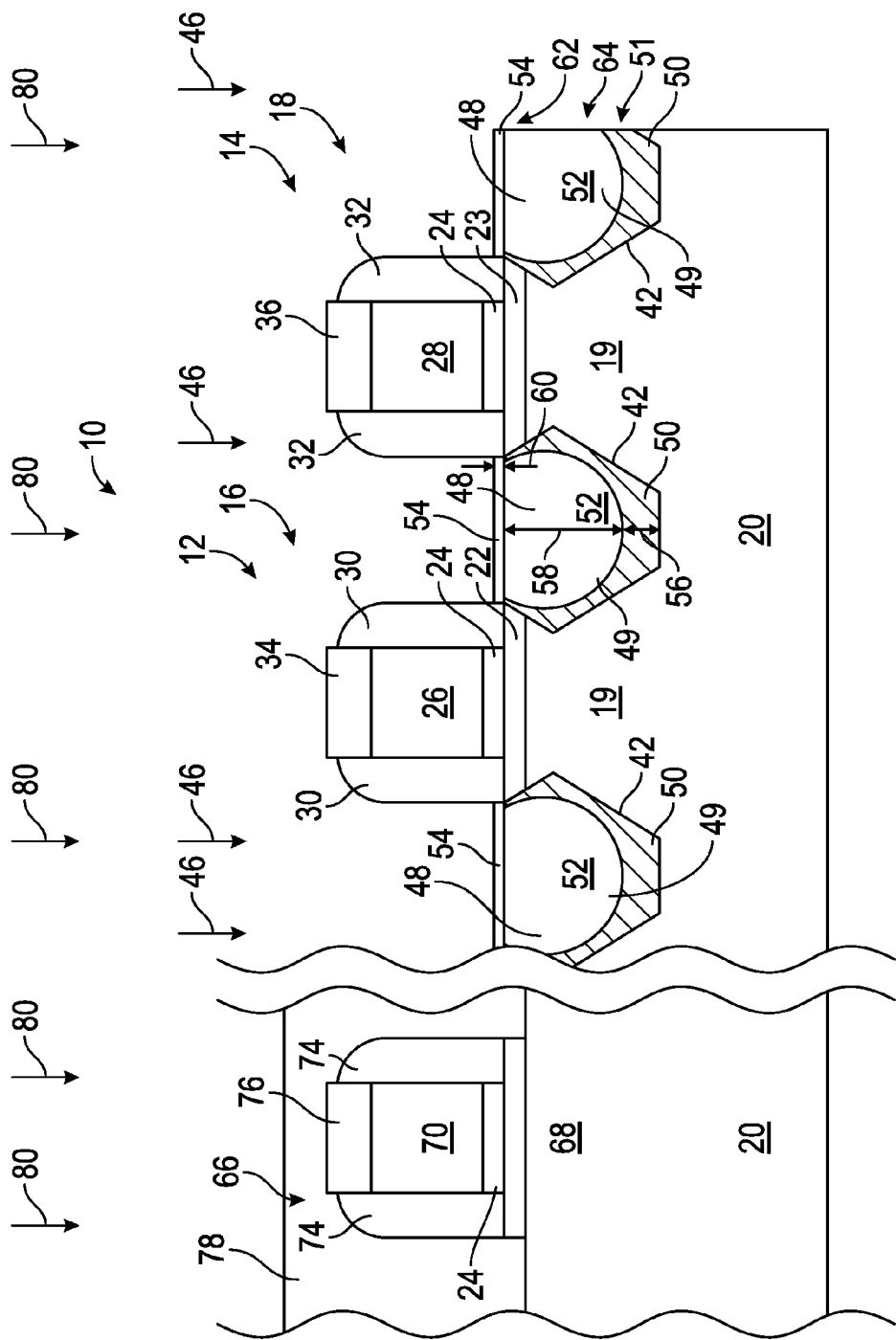
FIG. 3 illustrates, in cross-sectional view, an integrated circuit during a further advanced fabrication stage in accordance with an exemplary embodiment.

FIG. 3 illustrates, in cross-sectional view, the integrated circuit 10 during a further advanced fabrication stage in accordance with an exemplary embodiment. The semiconductor region 19 is exposed to a selective epitaxial growth process (indicated by arrows 46) to correspondingly deposit an EPI strain-inducing fill 48 in the sigma-shaped cavities 42. The selective epitaxial growth process 46 may be established on the basis of a silicon and germanium-containing precursor gas or gases and appropriate process parameters to obtain a selective deposition of a silicon-germanium alloy or alloys within the sigma-shaped cavities 42 while substantially avoiding a material deposition on the dielectric surfaces, such as the sidewall spacers 30 and 32 and the cap layers 34 and 36. In an exemplary embodiment and as will be discussed in further detail below, the selective epitaxial growth process 46 also uses an appropriate boron-containing precursor gas together with the silicon and germanium-containing precursor gas or gases to in-situ dope the EPI strain-inducing fill 48 with boron, which is a P-type conductivity-determining impurity, to form source and drain regions 49 for the MOS transistors 16 and 18. In an exemplary embodiment, the configuration of the sigma-shaped cavities 42 brings the EPI strain-inducing fill 48 of the source and drain regions 49 closer together to enhance the localized strain beneath the gate electrode structures 26 and 28 to further improve the compressive strain and carrier mobility in the channel regions 22 and 23.

As illustrated, the EPI strain-inducing fill 48 includes a buffer SiGe layer 50 in a lower portion 51 of the sigma-shaped cavities 42, a main SiGe layer 52 that overlies the buffer SiGe layer 50, and an Si cap 54 that overlies the main SiGe layer 52. In an exemplary embodiment, the selective epitaxial growth process 46 includes initially depositing the buffer SiGe layer 50 using a gas mixture (e.g., precursor gases) that includes $H_2$, DCS, $GeH_4$, HCl, and $B_2H_6$ and deposition conditions that includes a temperature of from about 600 to about 700° C., for example about 650° C., and a pressure of from about 8 to about 12 Torr, for example about 10 Torr. In one embodiment, the buffer SiGe layer 50 is formed having a thickness (indicated by double headed arrow 56) of from about 10 to about 30 nm, for example about 20 to about 30 nm, for example about 26 nm.

In an exemplary embodiment, the selective epitaxial growth process 46 continues by depositing the main SiGe layer 52 using a gas mixture (e.g., precursor gases) that includes $H_2$, $GeH_4$, $SiH_4$ and DCS, HCl, and $B_2H_4$ and deposition conditions that includes a temperature of from about 600 to about 700° C., for example about 650° C., and a pressure of from about 8 to about 12 Torr, for example about 10 Torr. In one embodiment, the main SiGe layer 52 is formed having a thickness (indicated by double headed arrow 58) of from about 20 to about 60 nm, such as from about 30 to about 40 nm, for example about 37 nm.

In an exemplary embodiment, the selective epitaxial growth process 46 continues by depositing the Si cap 54 using a gas mixture (e.g., precursor gases) that includes $H_2$, $SiH_4$+DCS, HCl, and $B_2H_4$ and deposition conditions that includes a temperature of from about 700 to about 800° C. and a pressure of from about 8 to about 12 Torr. In one embodiment, the Si cap 54 is formed having a thickness (indicated by single headed arrows 60) of from about 5 to about 30 nm, such as from about 15 to about 30 nm, for example about 20 nm.

In an exemplary embodiment, the deposition conditions and the gas mixtures including the mix ratios and/or concentrations of the precursor gases are adjusted and/or selected such that the selective epitaxial growth process 46 forms the EPI strain-inducing fill 48 having a first peak boron content in an upper portion 62 of the EPI strain-inducing fill 48 of about 2.5 times or greater, such as about 4 times or greater, for example from about 4 to about 10 times, than an average boron content in an intermediate portion 64 of the main SiGe layer 52. In one example, the upper portion 62 of the EPI strain-inducing fill 48 includes the Si cap 54 and a portion of the main SiGe layer 52 that is above the intermediate portion 64 and proximate the interface between the Si cap 54 and the main SiGe layer 52. In an exemplary embodiment, the first peak boron content is about $3 \times 10^{20}$ B atoms/cm³ or greater, such as from about $3 \times 10^{20}$ to about $6 \times 10^{20}$ B atoms/cm³, and the average boron content is from about $1.3 \times 10^{20}$ to about $1.8 \times 10^{20}$ B atoms/cm³.

As illustrated in FIG. 3, the integrated circuit 10 also includes a MOS transistor 66 that is fabricated on a different semiconductor region 68 of the silicon substrate 20. In an exemplary embodiment, a surface portion of the semiconductor region 68 is appropriately doped with conductivity-determining impurities (e.g., P-type conductivity-determining impurities such as B and the like) to define the MOS transistor 66 as an N-channel MOS transistor as is well known in the art. The MOS transistor 66 is similarly configured as the MOS transistors 16 and 18 including a gate electrode structure 70 that overlies a gate insulating material 24, sidewall spacers 74, and a cap layer 76.

Figure 4:
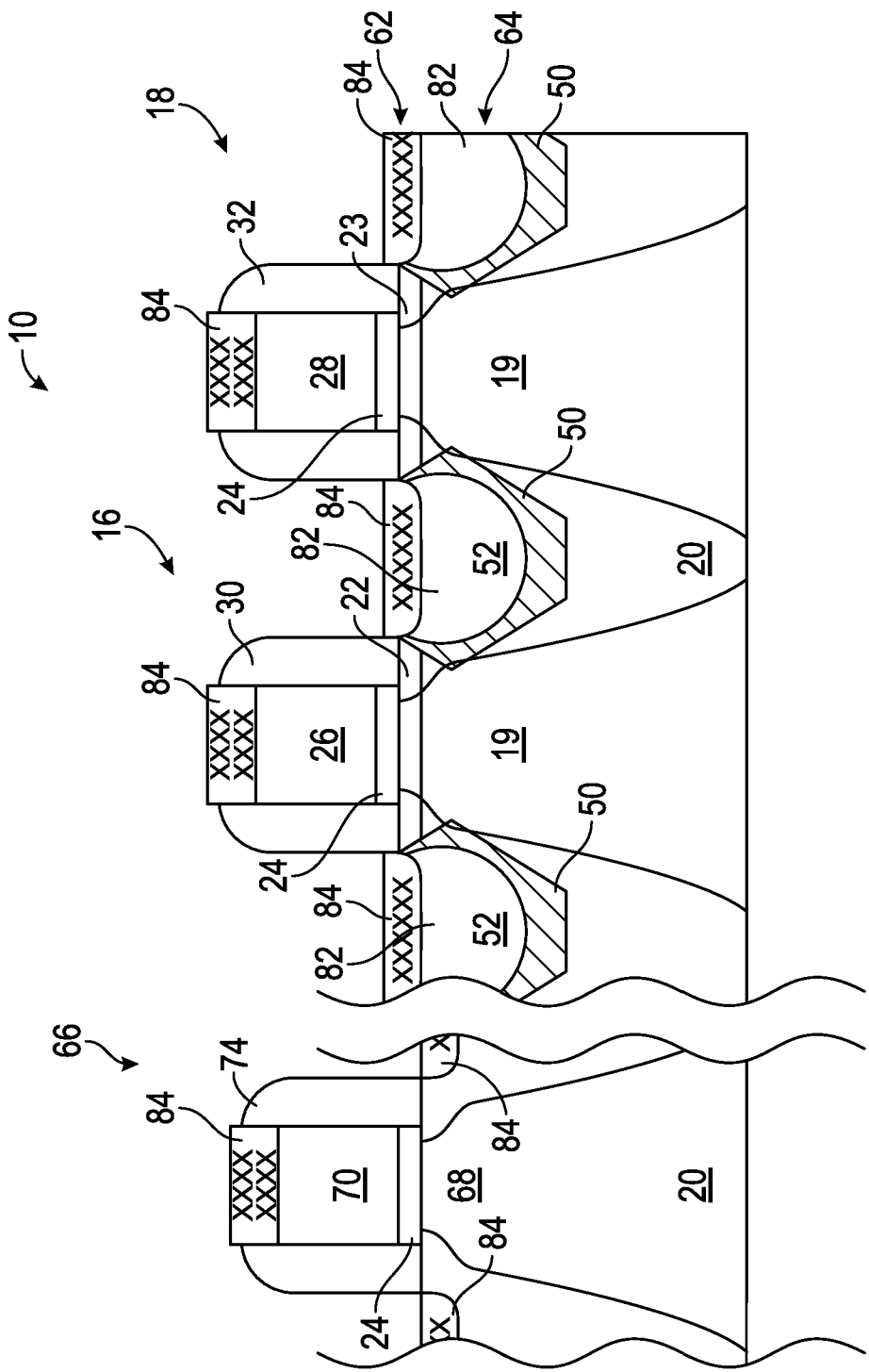
FIG. 4 illustrates, in cross-sectional view, an integrated circuit during a further advanced fabrication stage in accordance with an exemplary embodiment.

As illustrated, a photoresist layer 78 (e.g., an ArF photoresist layer for use with ArF laser lithography) is disposed overlying the MOS transistor 66. In an exemplary embodiment, the photoresist layer 78 is stripped with an $NH_3/O_2$ plasma (indicated by arrows 80) while exposing the EPI strain-inducing fill 48 to the $NH_3/O_2$ plasma 80. Referring also to FIG. 4, during stripping, the photoresist layer 78 is removed and hydrogen generated from the $NH_3/O_2$ plasma 80 diffuses into the EPI strain-inducing fill 48. In an exemplary embodiment, during stripping the EPI strain-inducing fill 48 is heated to a temperature of from about 250 to about 300° C.

As those skilled in the art will appreciate, the integrated circuit 10 is subsequently subjected to downstream processing including additional depositions, implantations, and annealing to create drain extensions, halo implants, deep source and drains, metal silicide regions 84, and the like as are well known in the art. During stripping and/or downstream processing, the EPI strain-inducing fill 48 is heated one or more times, such as, for example, to a temperature of about 250° C. or greater, and the diffused hydrogen tends to concentrate about portions of the EPI strain-inducing fill 48 that have higher boron content, forming a hydrogen agglomerated EPI strain-inducing fill 82. In an exemplary embodiment, the hydrogen agglomerated EPI strain-inducing fill 82 has a peak hydrogen content in the upper portion 62 of about 10 times or greater (e.g., about 10 to about 100 times) than an average hydrogen content in the intermediate portion 64 of the main SiGe layer 52. In one embodiment, the peak hydrogen content is of about $1 \times 10^{20}$ H atoms/cm$^3$ or greater, such as from about $1 \times 10^{20}$ to about $10 \times 10^{20}$ H atoms/cm$^3$, and the average hydrogen content is of about $1 \times 10^{18}$ or less H atoms/cm$^3$, such as from about $0.1 \times 10^{18}$ to about $10 \times 10^{18}$ or less H atoms/cm$^3$. It has been found that by concentrating the diffused hydrogen in or proximate the Si cap 54 instead of in or proximate the lower portions, e.g., intermediate and/or lower portions 64 and/or 51, of the EPI strain-inducing fill 48, the formation of bubbles or blisters is minimized or eliminated to reduce, minimize, or eliminate localized delamination of the EPI strain-inducing fill 48.

Accordingly, integrated circuits including an epitaxially grown (EPI) strain-inducing fill and methods for fabricating such integrated circuits have been described. In an exemplary embodiment, during intermediate stages of fabrication of an integrated circuit (IC), a cavity is formed in a semiconductor region laterally adjacent to a gate electrode structure. An EPI strain-inducing fill is deposited into the cavity. The EPI strain-inducing fill includes a main SiGe layer and a Si cap that overlies the main SiGe layer. The EPI strain-inducing fill is doped with boron and has a first peak boron content in an upper portion of the EPI strain-inducing fill of about 2.5 times or greater than an average boron content in an intermediate portion of the main SiGe layer.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. An integrated circuit comprising:
   a silicon-containing semiconductor region;
   a channel region formed in the silicon-containing semiconductor region;
   a gate electrode structure formed above the channel region;
   source and drain regions formed in the silicon-containing semiconductor region adjacent to the channel region, wherein the source and drain regions comprise an EPI strain-inducing fill that comprises a main SiGe layer and a Si cap that overlies the main SiGe layer, and wherein the EPI strain-inducing fill is doped with boron and has a first peak boron content in an upper portion of the EPI strain-inducing fill of about 2.5 times or greater than an average boron content in an intermediate portion of the main SiGe layer; and
   a metal silicide formed in the EPI strain-inducing fill and at least partially in the source and drain regions, wherein the EPI strain-inducing fill has hydrogen concentrated therein to define the EPI strain-inducing fill as a hydrogen agglomerated EPI strain-inducing fill, wherein the hydrogen agglomerated EPI strain-inducing fill has a peak hydrogen content in the upper portion of the hydrogen agglomerated EPI strain-inducing fill of about 10 times or greater than an average hydrogen content in the intermediate portion of the main SiGe layer.

2. A method for fabricating an integrated circuit comprising:
   forming a cavity in a semiconductor region laterally adjacent to a gate electrode structure; and
   depositing an EPI strain-inducing fill into the cavity, wherein the EPI strain-inducing fill comprises a main SiGe layer and a Si cap that overlies the main SiGe layer, and wherein the EPI strain-inducing fill is doped with boron and has a first peak boron content in an upper portion of the EPI strain-inducing fill of about 2.5 times or greater than an average boron content in an intermediate portion of the main SiGe layer, wherein the gate electrode structure is a first gate electrode structure of a P-type transistor, and wherein the method further comprises:
   stripping a photoresist layer that overlies of a second gate electrode structure of an N-type transistor with an NH$_3$/O$_2$ plasma while exposing the EPI strain-inducing fill to the NH$_3$/O$_2$ plasma, thereby diffusing hydrogen into the EPI strain-inducing fill; and
   heating the EPI strain-inducing fill to a temperature of about 250° C. or greater during stripping or further downstream processing, thereby concentrating hydrogen and forming a hydrogen agglomerated EPI strain-inducing fill, wherein the hydrogen agglomerated EPI strain-inducing fill has a peak hydrogen content in the upper portion of the hydrogen agglomerated EPI strain-inducing fill of about 10 times or greater than an average hydrogen content in the intermediate portion of the main SiGe layer.

3. The method of claim 2, wherein depositing comprises forming the EPI strain-inducing fill having the first peak boron content of about 4 times or greater than the average boron content.

4. The method of claim 2, wherein depositing comprises forming the EPI strain-inducing fill having the first peak boron content of about $3 \times 10^{20}$ B atoms/cm$^3$ or greater.

5. The method of claim 2, wherein depositing comprises forming the EPI strain-inducing fill having the average boron content of from about $1.3 \times 10^{20}$ to about $1.8 \times 10^{20}$ B atoms/cm$^3$.

6. The method of claim 2, wherein depositing comprises:
   depositing a buffer SiGe layer in a lower portion of the cavity; and
   depositing the main SiGe layer overlying the buffer SiGe layer.

7. The method of claim 6, wherein depositing comprises forming the buffer and main SiGe layers having thicknesses of from about 10 to about 30 nm and from about 20 to about 60 nm, respectively.

8. The method of claim 2, wherein depositing the EPI strain-inducing fill comprises depositing the EPI strain-inducing fill via a selective epitaxial growth process using a gas that comprises B$_2$H$_6$ to in-situ boron dope the EPI strain-inducing fill.

9. The method of claim 2, wherein heating comprises forming the hydrogen agglomerated EPI strain-inducing fill having the peak hydrogen content of about $1\times10^{20}$ H atoms/cm$^3$ or greater and the average hydrogen content of about $1\times10^{18}$ or less H atoms/cm$^3$.

10. A method for fabricating an integrated circuit comprising:
- etching a cavity in a semiconductor region laterally adjacent to a gate electrode structure;
- epitaxially growing a buffer SiGe layer in a lower portion of the cavity;
- epitaxially growing a main SiGe layer that is in-situ boron doped in the cavity overlying the buffer SiGe layer; and
- depositing a Si cap that is in-situ boron doped overlying the main SiGe layer such that a peak boron content in the Si cap or proximate an interface of the main SiGe layer and the Si cap is of about 2.5 times or greater than an average boron content in an intermediate portion of the main SiGe layer, wherein the buffer SiGe layer, the main SiGe layer, and the Si cap together define an EPI strain-inducing fill, wherein the gate electrode structure is a first gate electrode structure of a P-type transistor, and wherein the method further comprises:
- stripping a photoresist layer that overlies of a second gate electrode structure of an N-type transistor with an NH$_3$/O$_2$ plasma while exposing the EPI strain-inducing fill to the NH$_3$/O$_2$ plasma, thereby diffusing hydrogen into the EPI strain-inducing fill; and
- heating the EPI strain-inducing fill to a temperature of about 250° C. or greater during stripping or further downstream processing, thereby concentrating hydrogen and forming a hydrogen agglomerated EPI strain-inducing fill, wherein the hydrogen agglomerated EPI strain-inducing fill has a peak hydrogen content in the upper portion of the hydrogen agglomerated EPI strain-inducing fill of about 10 times or greater than an average hydrogen content in the intermediate portion of the main SiGe layer.

11. The method of claim 10, wherein epitaxially growing the buffer SiGe layer and the main SiGe layer comprise epitaxially growing the buffer SiGe layer and the main SiGe layer at about the same temperature.

12. The method of claim 10, wherein epitaxially growing the buffer SiGe layer comprises epitaxially growing the buffer SiGe layer at a first temperature of from about 600 to about 700° C., and wherein epitaxially growing the main SiGe layer comprises epitaxially growing the main SiGe layer at a second temperature of from about 600 to about 700° C.

13. The method of claim 10, wherein epitaxially growing the buffer SiGe layer and the main SiGe layer comprise epitaxially growing the buffer SiGe layer and the main SiGe layer at about the same pressure.

14. The method of claim 10, wherein epitaxially growing the buffer SiGe layer comprises epitaxially growing the buffer SiGe layer at a first pressure of from about 8 to about 12 Torr, and wherein epitaxially growing the main SiGe layer comprises epitaxially growing the main SiGe layer at a second pressure of from about 8 to about 12 Torr.

15. The method of claim 10, wherein epitaxially growing the buffer SiGe layer and the main SiGe layer comprises epitaxially growing the buffer SiGe layer and the main SiGe layer using a gas mixture comprising H$_2$, DCS, SiH$_4$, GeH$_4$, HCl, B$_2$H$_6$.

16. The method of claim 10, wherein depositing the Si cap comprises epitaxially growing the Si cap at a temperature of from about 700 to about 800° C.

17. The method of claim 10, wherein depositing the Si cap comprises epitaxially growing the Si cap at a pressure of from about 8 to about 12 Torr.

18. The method of claim 10, wherein depositing the Si cap comprises epitaxially growing the Si cap using a gas mixture comprising H$_2$, SiH$_4$ and DCS, HCl, and B$_2$H$_6$.

19. The method of claim 10, wherein etching the cavity comprises:
- dry etching the semiconductor region to form a box-shaped cavity; and
- wet etching the semiconductor region including the box-shaped cavity to redefine the box-shaped cavity forming a sigma-shaped cavity, wherein the sigma-shaped cavity defines the cavity.

* * * * *